(12) United States Patent
Moon et al.

(10) Patent No.: US 8,193,030 B2
(45) Date of Patent: Jun. 5, 2012

(54) METHODS OF FABRICATING NON-VOLATILE MEMORY DEVICES HAVING CARBON NANOTUBE LAYER AND PASSIVATION LAYER

(75) Inventors: Chang-wook Moon, Seoul (KR); Joong S. Jeon, Seongnam-si (KR); El Mostafa Bourim, Yongin-si (KR); Hyun-deok Yang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/929,122

(22) Filed: Jan. 3, 2011

(65) Prior Publication Data

US 2011/0117735 A1    May 19, 2011

Related U.S. Application Data

(62) Division of application No. 11/980,346, filed on Oct. 31, 2007, now Pat. No. 7,884,410.

(30) Foreign Application Priority Data

Nov. 21, 2006 (KR) .................. 10-2006-0115425

(51) Int. Cl.
*H01L 29/861*    (2006.01)

(52) U.S. Cl. ........... 438/104; 257/E21.006; 257/E21.28; 257/E21.291; 438/686; 438/688; 438/957; 438/958; 977/735; 977/742; 977/943

(58) Field of Classification Search .......... 257/E21.006, 257/E21.28, E21.291; 438/104, 686, 688, 438/722, 957, 958; 977/734–753, 943
See application file for complete search history.

(56) References Cited

U.S. PATENT DOCUMENTS

| 6,700,146 | B2 | 3/2004 | Ito |
| 6,784,069 | B1 | 8/2004 | Patraw et al. |
| 6,911,373 | B2 | 6/2005 | Kellar et al. |
| 2007/0126043 | A1 | 6/2007 | Moon et al. |
| 2007/0194367 | A1 | 8/2007 | Moon et al. |

*Primary Examiner* — Anh Phung
*Assistant Examiner* — Michael Lulis
(74) *Attorney, Agent, or Firm* — Harness, Dickey & Pierce, P.L.C.

(57) ABSTRACT

Nonvolatile memory devices may be fabricated to include a switching device on a substrate and/or a storage node electrically connected to the switching device. A storage node may include a lower metal layer electrically connected to the switching device, a first insulating layer, a middle metal layer, a second insulating layer, an upper metal layer, a carbon nanotube layer, and/or a passivation layer stacked on the lower metal layer.

10 Claims, 5 Drawing Sheets

METHODS OF FABRICATING NON-VOLATILE MEMORY DEVICES HAVING CARBON NANOTUBE LAYER AND PASSIVATION LAYER

PRIORITY STATEMENT

This application is a divisional of, and claims priority under 35 U.S.C. §§120 & 121 to, application Ser. No. 11/980,346, filed Oct. 31, 2007 now U.S. Pat. No. 7,884,410 in the USPTO, which claims benefit under §119 to Korean Patent Application No. 10-2006-0115425, filed on Nov. 21, 2006, in the Korean Intellectual Property Office. The disclosure of all abovementioned applications is incorporated herein by reference in their entirety.

BACKGROUND

1. Field

Example embodiments may relate to nonvolatile memory devices and/or methods of fabricating nonvolatile memory devices.

2. Description of the Related Art

Related art volatile memory devices, such as DRAMs, may have increased integration density, reduced power consumption, and/or a simplified, familiar manufacturing process, but related art volatile memory devices may lose stored data if power is turned off. Related art nonvolatile memory devices, such as flash memory devices, may have a high erasing voltage, lower integration density, and/or slower operation speed, but related art nonvolatile memory devices may maintain stored data even if power is turned off.

Related art nonvolatile memory devices such as FRAM, MRAM, PRAM, and RRAM have been developed and commercialized. In these related art nonvolatile memory devices, approximately the same integration density and operational characteristics of DRAMs may be obtained. Related art nonvolatile memory devices may be manufactured using related art semiconductor memory device manufacturing processes and may maintain stored data if power is turned off.

Storage nodes may be configured differently among a related art ferroelectric random access memory (FRAM), magnetic random access memory (MRAM), phase change random access memory (PRAM), and a resistance random access memory (RRAM).

A storage node of a FRAM may include an upper electrode, a lower electrode, and/or a ferroelectric. A storage node of an MRAM may include an upper magnetic layer, a lower magnetic layer, and/or a tunneling film therebetween. A magnetic polarization direction of one of the upper magnetic layer and the lower magnetic layer of the MRAM may be fixed in a given direction, and that of the other layer may be in the same or opposite direction. The other layer may be a free layer.

A PRAM may include an upper electrode, a lower electrode, a phase change layer between the upper and lower electrodes, and/or a contact that connects the lower electrode and the phase change layer.

An RRAM may include an upper metal layer, a lower metal layer, and/or an insulating layer (a resistance layer) therebetween.

Operational characteristics of related art nonvolatile memory devices may depend on current-voltage characteristics of a material layer in a storage node on which data may be recorded.

For example, in the insulating layer of a storage node of a RRAM, the resistance characteristics may change according to a voltage applied. Changed resistance characteristics may not further change until an erase voltage is applied, even if power is turned off.

RRAM may have a nonvolatile characteristic as described above, lower reproducibility, larger resistance deviations, and/or a more easily damaged upper electrode.

SUMMARY

Example embodiments may provide nonvolatile memory devices in which an upper electrode may be protected with improved memory characteristics.

Example embodiments may also provide methods of fabricating nonvolatile memory devices with improved resistance layer characteristics through a passivation layer and/or anodizing.

Example embodiments may provide nonvolatile memory devices including a switching device on a substrate and/or a storage node connected to the switching device. The storage node may include a lower metal layer connected to the switching device and a first insulating layer, a middle metal layer, a second insulating layer, an upper metal layer, a carbon nanotube layer, and/or a passivation layer stacked on the lower metal layer.

The lower metal layer and the middle metal layer may each be formed of, for example, Aluminum (Al).

The first and second insulating layers may be alumina layers each formed by anodizing the lower metal layer and/or the middle metal layer.

The carbon nanotube layer may be a fullerene layer including, for example, a $C_{60}$ layer, a $C_{70}$ layer, a $C_{72}$ layer, a $C_{74}$ layer, a $C_{76}$ layer, a $C_{82}$ layer, a $C_{84}$ layer, a $C_{86}$ layer, and/or a $C_{116}$ layer.

The passivation layer may be, for example, a silicon oxide layer.

The passivation layer may be formed to a thickness of about 2 nm to about 20 nm.

The upper metal layer may be a metal layer having a lower work function.

The upper metal layer may be, for example, a Gold (Au) layer.

Example methods of fabricating nonvolatile memory devices may include forming a lower metal layer connected to the switching device on the substrate, forming a first oxide on a surface of the lower metal layer by anodizing the lower metal layer, forming a middle metal layer on the first oxide, forming a second oxide on a surface of the middle metal layer by anodizing the middle metal layer, forming an upper metal layer on the second oxide, forming a carbon nanotube layer on the upper metal layer, and/or forming a passivation layer on the carbon nanotube layer.

Forming of the lower metal layer may include forming an Al layer. Forming of the first oxide may include forming an Aluminum oxide, for example, $Al_2O_3$, layer on a surface of the Al layer by anodizing the Al layer.

Forming of the first oxide may include forming a first $Al_2O_3$ layer on the lower metal layer by primarily anodizing the Al layer, etching a surface of the first $Al_2O_3$ layer, and/or forming a second $Al_2O_3$ layer on the surface of the Al layer by secondarily anodizing the Al layer.

Forming of the middle metal layer may include forming an Al layer. Forming of the second oxide may include forming an $Al_2O_3$ layer on a surface of the Al layer by anodizing the Al layer.

Forming of the second oxide may include forming a third $Al_2O_3$ layer on the middle metal layer by primarily anodizing the Al layer, etching a surface of the third $Al_2O_3$ layer, and/or forming a fourth $Al_2O_3$ layer on the surface of the Al layer by secondarily anodizing the Al layer.

Forming of the upper metal layer may include forming the upper metal layer using Au.

Forming of the carbon nanotube layer may include forming a fullerene layer including a $C_{60}$ layer, a $C_{70}$ layer, a $C_{72}$ layer, a $C_{74}$ layer, a $C_{76}$ layer, a $C_{82}$ layer, a $C_{84}$ layer, a $C_{86}$ layer, and/or a $C_{116}$ layer.

Forming of the passivation layer may include forming a silicon oxide layer.

BRIEF DESCRIPTION OF THE DRAWINGS

The above and/or other features and advantages of example embodiments will become more apparent by describing in detail the attached drawings in which.

DETAILED DESCRIPTION

Figure 1:
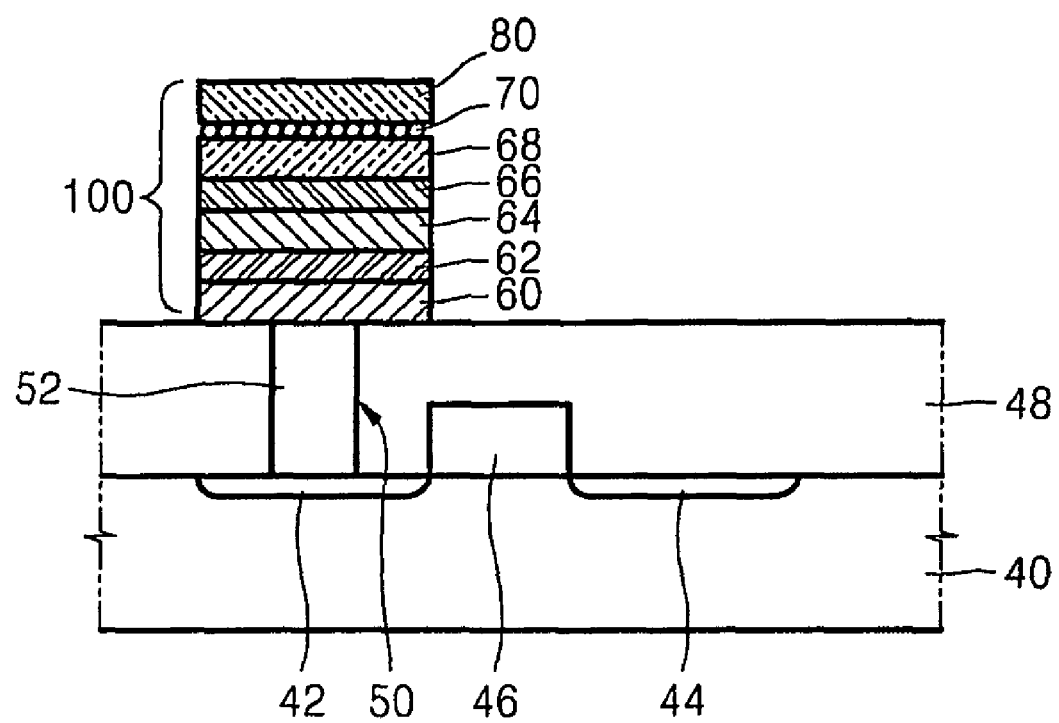
FIG. 1 is a cross-sectional view illustrating an example embodiment nonvolatile memory device.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 shows a cross-sectional view illustrating an example embodiment nonvolatile memory device.

As shown in FIG. 1, a first impurity region 42 and a second impurity region 44 separated from each other may be on a surface of or implanted in a substrate 40. The first impurity region 42 and the second impurity region 44 may be P type impurity region and/or N type impurity regions. One of the first impurity region 42 and the second impurity region 44 may be a source region and the other one may be a drain region.

A gate 46 may be on the substrate 40 between the first impurity region 42 and the second impurity region 44. The substrate 40, the first impurity region 42, the second impurity region 44, and the gate 46 may form a transistor. The transistor may be replaced by another switching device in example embodiments, for example, a PN contact diode.

An insulating interlayer 48 covering the gate 46 may be on the substrate 40. A contact hole 50 in the insulating interlayer 48 may expose the first impurity region 42 is formed in the insulating interlayer 48. The contact hole 50 may be filled with a conductive plug 52.

A storage node 100 may be electrically connected to the conductive plug 52 and may be on the insulating interlayer 48. The storage node 100 may include a lower metal layer 60 that may be electrically connected with the conductive plug 52 and/or may contact a portion of the insulating interlayer 48 around the conductive plug 52.

The storage node 100 may include a first insulating layer 62, a middle metal layer 64, a second insulating layer 66, and/or an upper metal layer 68 sequentially formed on the lower metal layer 60. The storage node 100 may include a nano layer 70 and/or a passivation layer 80 on the upper metal layer 68.

The lower metal layer 60 may be formed of, for example, Al, to a thickness of about 100 nm and may contain an amount of niodium (Nd), for example, about 2 wt % Nd, for increasing the adhesiveness of the lower metal layer 60.

The first insulating layer 62 may be, for example, an alumina $Al_2O_3$ layer, configured to be formed by anodizing the lower metal layer 60. The first insulating layer 62 may have a tighter texture by twice anodizing the lower metal layer 60. Such anodizing improves the memory characteristics of the nonvolatile memory device.

The middle metal layer 64 may include Al containing a small amount of niodium Nd, for example, 2 wt % Nd, to a thickness of about 15 nm to about 30 nm. Nd may be used for increasing the adhesiveness of the middle metal layer 64.

The second insulating layer 66 may be, for example, an alumina $Al_2O_3$ layer, configured to be formed by anodizing the middle metal layer 64. The second insulating layer 66 may have a tighter texture by twice anodizing the middle metal layer 64. Anodizing may improve memory characteristics of example embodiment nonvolatile memory devices.

The upper metal layer 68 may be formed of a metal having a lower work function, for example, Au, to a thickness of about 2 nm to about 20 nm.

The nano layer 70 may be a fullerene layer. The fullerene layer may be, for example, a $C_{60}$ layer, a $C_{70}$ layer, a $C_{72}$ layer, a $C_{74}$ layer, a $C_{76}$ layer, a $C_{82}$ layer, a $C_{84}$ layer, a $C_{86}$ layer, and/or a $C_{116}$ layer.

The passivation layer 80 may be, for example, a silicon oxide layer $SiO_2$, formed to a thickness of about 2 nm to about 20 nm. The nano layer 70 and/or the passivation layer 80 may protect the upper metal layer 68 and may maintain characteristics of example embodiment memory devices through a mutual chemical action with the upper metal layer 68.

Figure 2:
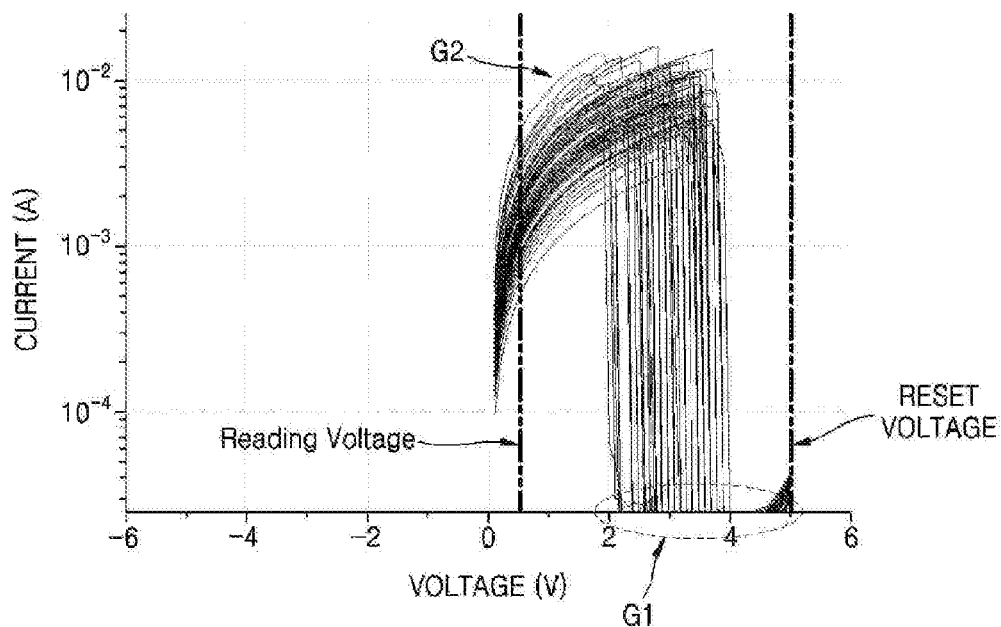
FIGS. 2 and 3 are graphs showing Current-Voltage characteristics of example embodiment nonvolatile memory devices.
Figure 3:
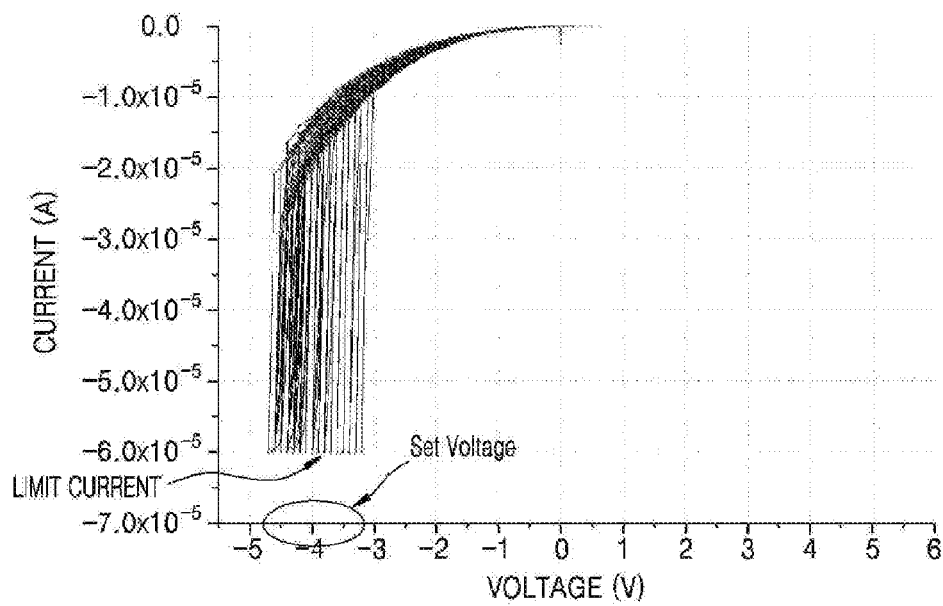

FIGS. 2 and 3 are graphs showing Current-Voltage characteristics of example embodiment nonvolatile memory devices.

A first portion G1 indicates a higher resistance state (first state), and a second portion G2 indicates a lower resistance state (second state). If the current-voltage characteristics of example embodiment nonvolatile memory devices correspond to the second portion G2, and a negative voltage, for example, −4V, and a current below 60 mA are applied to the storage node 100, the current-voltage characteristics of example embodiment nonvolatile memory devices may change to correspond to the first portion G1. The voltage applied to the storage node 100 at this point may be a set voltage, and data, for example, "1", may be recorded in example embodiment nonvolatile memory device.

If the current-voltage characteristics of example embodiment nonvolatile memory devices corresponds to the first portion G1 and a voltage, for example, greater than 4.5V, is applied to the storage node 100, the characteristics of example embodiment nonvolatile memory devices may change to the second portion G2. The voltage applied to the storage node 100 at this point may be a reset voltage, and data, for example, "0" may be recorded in example embodiment nonvolatile memory device.

To read data recorded in example embodiment nonvolatile memory devices, a voltage of about 0.5 V to about 1.5 V may be applied to the storage node 100. If a current that flows in the storage node 100 is read, it may be determined if the current-voltage characteristics correspond to the first portion G1 or the second portion G2. Accordingly, data recorded in example embodiment nonvolatile memory device may be read.

In example embodiment nonvolatile memory devices, there may be larger differences in current values based on the content of recorded data. Current corresponding to the first portion G2 may be about 100 times greater than current corresponding to the second portion G1, and measured current may be lower.

An example method of fabricating nonvolatile memory devices may now be described.

FIGS. 4A through 4I are cross-sectional views illustrating an example method of fabricating a nonvolatile memory device. Like reference numerals are used to indicate elements that are substantially similar to the elements of FIG. 1, and thus the detailed description thereof may not be repeated.

Figure 4A:
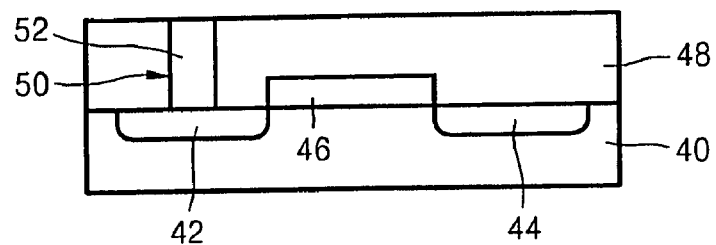
FIGS. 4A through 4I are cross-sectional views illustrating an example method of fabricating nonvolatile memory devices.

As shown in FIG. 4A, a gate stack 46 may be formed on a substrate 40 doped with a P type or N type impurity. The gate stack 46 may include a gate insulating film and/or a gate electrode. A first impurity region 42 and/or a second impurity region 44 may be formed on either side of the gate stack 46 in a surface of the substrate 40. The first impurity region 42 and/or the second impurity region 44 may be formed by ion injection an appropriate impurity. The first impurity region 42 may be used as a source region and the second impurity region 44 may be used as a drain region, or vice versa. The first impurity region 42, the second impurity region 44, and/or the gate stack 46 may constitute a semiconductor transistor.

An insulating interlayer 48 covering the transistor may be formed on the substrate 40. A contact hole 50 may be formed in the insulating interlayer 48 so as to expose the first impurity region 42. The contact hole 50 may be formed to expose the second impurity region 44 instead of the first impurity region 42. The contact hole 50 may be filled with a conductive plug 52.

Figure 4B:
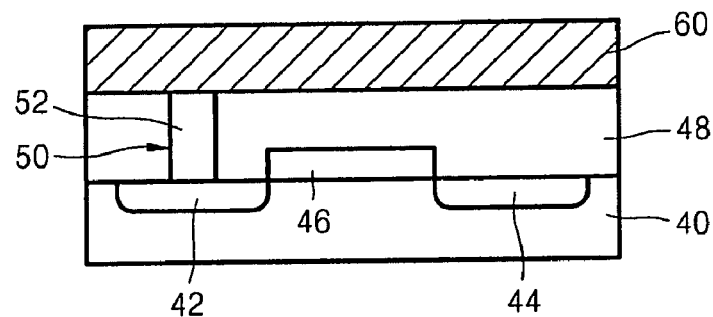

As shown in FIG. 4B, a lower metal layer 60 that covers an exposed upper surface of the conductive plug 52 may be formed on the insulating interlayer 48. The lower metal layer 60 may be, for example, an Al layer formed to a thickness of about 100 nm and may contain a small amount of niodium Nd, for example, 2 wt %. The lower metal layer 60 may be formed by sputtering the Al layer containing Nd as a target. Nd may increase the adhesiveness of the lower metal layer 60.

Figure 4C:
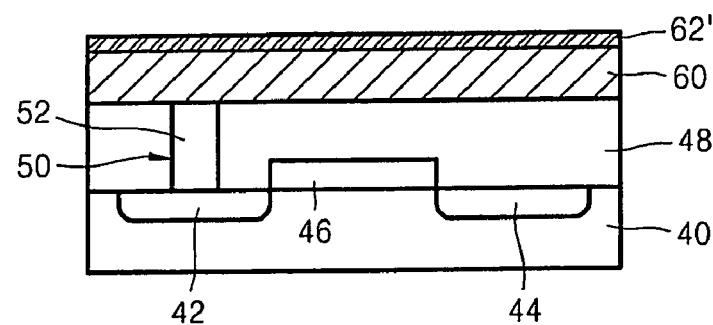

As shown in FIG. 4C, a first $Al_2O_3$ layer 62' having a thickness of, for example, about 10 nm may be formed from a surface of the lower metal layer 60 by primarily anodizing the lower metal layer 60. For the primary anodizing, the substrate 40 may be put into a solution, and the lower metal layer 60 may be connected to a positive electrode and, for example, platinum (Pt) may be connected to a negative electrode. A voltage of about 5V (about 5 μA current) may be applied to the both electrodes. Approximately one hour later, the first $Al_2O_3$ layer 62' may be formed by the anodization of the Al layer, that is, the lower metal layer 60.

Next, a surface of the first $Al_2O_3$ layer 62' may be etched by dipping the substrate 40 in an etchant to remove rough portions of the anodized surface and impurities.

Figure 4D:
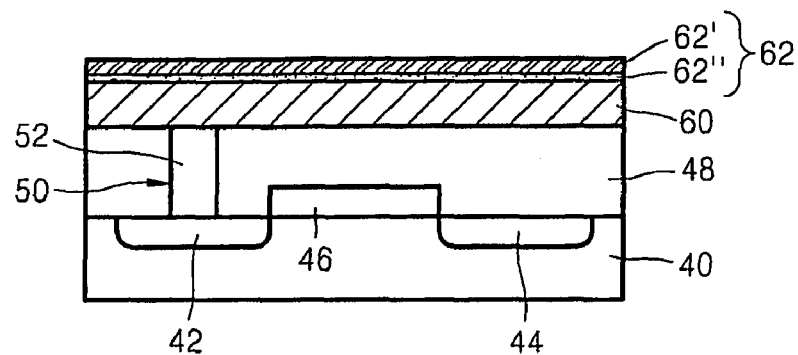

As shown in FIG. 4D, a second $Al_2O_3$ layer 62" having a thickness of, for example, about 2 nm from the surface of the lower metal layer 60 may be formed by secondarily anodizing the lower metal layer 60. The secondary anodizing may be performed using a similar anodizing method as in the primary anodizing. The secondary anodizing may increase texture density between the Al layer, the first $Al_2O_3$ layer 62', and/or the second $Al_2O_3$ layer 62". Thus, a nonvolatile memory device fabricated in this example method may have improved characteristics. The first $Al_2O_3$ layer 62' and the second $Al_2O_3$ layer 62" may constitute the first insulating layer 62 of FIG. 1.

Figure 4E:
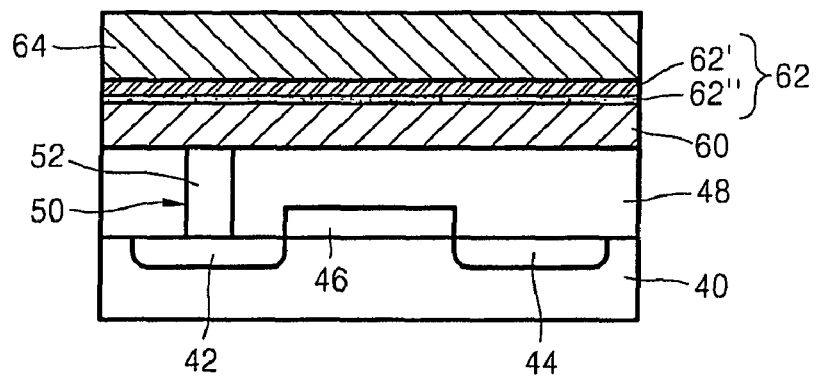

As shown in FIG. 4E, a middle metal layer 64 may be formed on the first insulating layer 62. The middle metal layer 64 may be, for example, an Al layer containing a small amount of niodium Nd, for example, 2 wt %, and may be formed to a thickness of about 15 nm to about 30 nm. The middle metal layer 64 may be formed by sputtering the Al layer containing Nd as a target. Nd may increase adhesiveness of the middle metal layer 64.

Figure 4F:
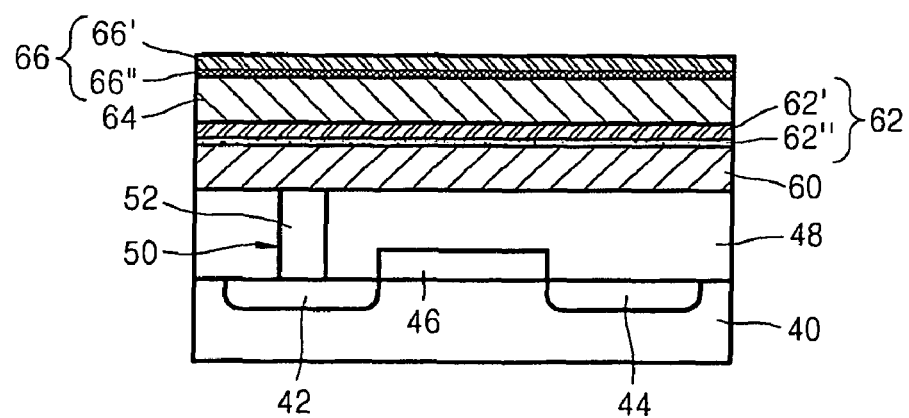

As shown in FIG. 4F, a third $Al_2O_3$ layer 66' may be formed from a surface of the middle metal layer 64 by primarily anodizing the middle metal layer 64. Next, a surface of the third $Al_2O_3$ layer 66' may be etched by dipping the substrate 40 in an etchant to remove rough portions of the surface of the third $Al_2O_3$ layer 66'.

A fourth $Al_2O_3$ layer 66" may be formed from a surface of the middle metal layer 64 by secondarily anodizing the middle metal layer 64. The secondary anodizing may increase the texture density between the Al layer 64 and the third $Al_2O_3$ layer 66' and the fourth $Al_2O_3$ layer 66". Thus, a nonvolatile memory device fabricated by this example method may have improved characteristics. The third $Al_2O_3$ layer 66' and the fourth $Al_2O_3$ layer 66" may constitute the second insulating layer 66 of FIG. 1.

Next, the substrate 40 may be rapidly thermally annealed at a temperature of about 300° C. to about 500° C. for about 5 seconds to about 100 seconds. The thermal annealing may stabilize a stack on the substrate 40.

Figure 4G:
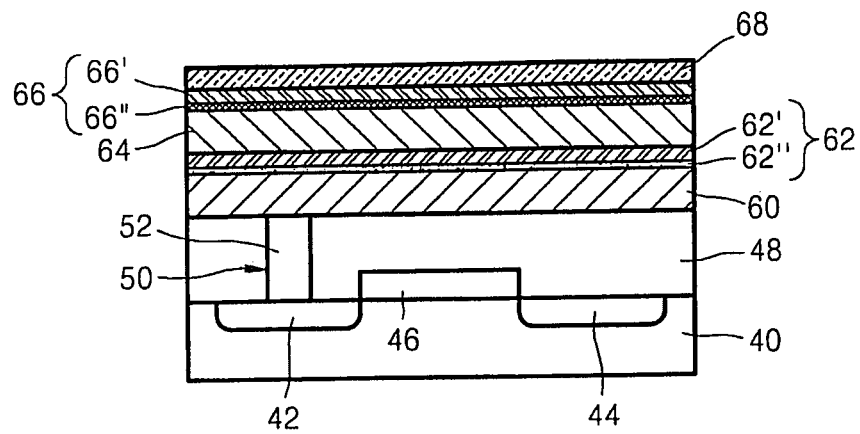

As shown in FIG. 4G, an upper metal layer 68 may be formed to a thickness of about 2 to about 20 nm using a metal having a lower work function, for example, Au, on the second insulating layer 66.

Figure 4H:
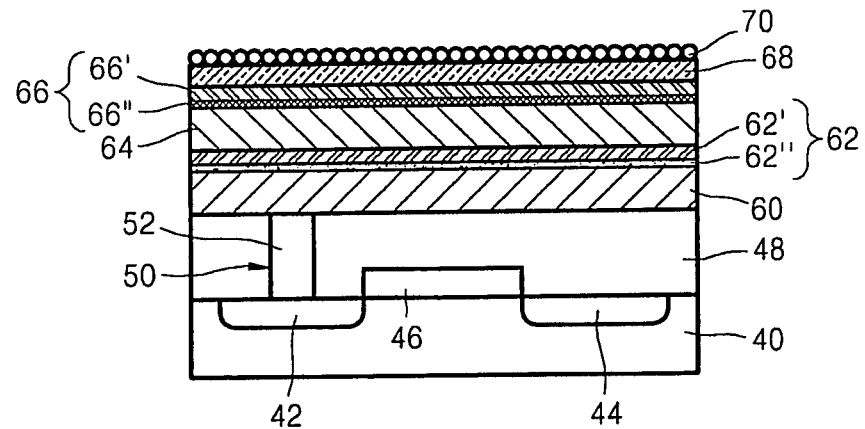

As shown in FIG. 4H, a carbon nanotube layer 70, for example, a fullerene layer, may be formed on the upper metal layer 68. The fullerene layer may be, for example, a $C_{60}$ layer, a Cm layer, a $C_{72}$ layer, a $C_{74}$ layer, a $C_{76}$ layer, a $C_{82}$ layer, a $C_{84}$ layer, a $C_{86}$ layer, and/or a $C_{116}$ layer. The fullerene layer may be formed by depositing powder state fullerene using a diffusive deposition method.

Figure 4I:
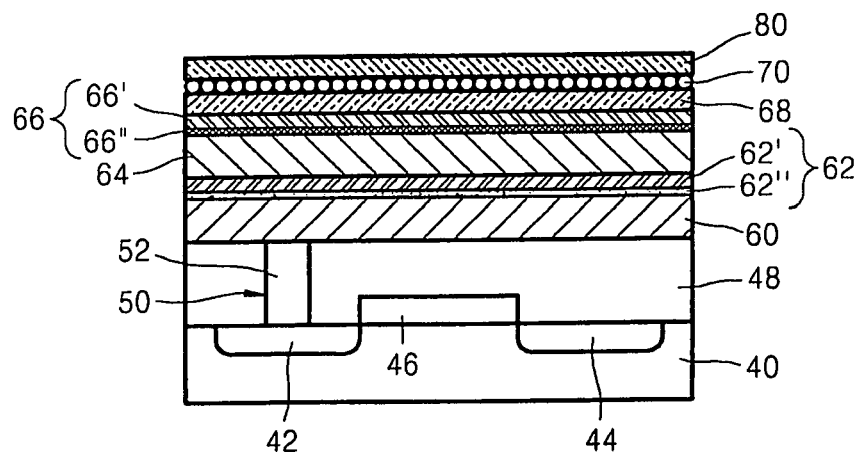

As shown in FIG. 4I, a passivation layer 80, for example, a silicon oxide layer ($SiO_2$), may be formed to a thickness of about 1 nm to about 900 nm, for example, about 2 nm to about 20 nm on the carbon nanotube layer 70.

After a photosensitive pattern (not shown) that defines a storage node region may be formed on a stack on the insulating interlayer 48, the stack may be etched using the photosensitive pattern as an etch mask. As a result of the example method, a nonvolatile memory device similar to the example embodiment nonvolatile memory device depicted in FIG. 1 may be completed.

Example embodiment nonvolatile memory devices may have improved memory characteristics due to a carbon nanotube layer and/or a passivation layer on an upper metal layer.

Example methods of fabricating a nonvolatile memory devices may increase the texture density between an insulating layer and a metal layer by forming two insulating layers by anodizing twice a lower metal layer and a middle layer.

While example embodiments have been particularly shown and described with reference to the attached drawings, it will be understood by those of ordinary skill in the art that various changes in form and details may be made therein without departing from the spirit and scope of the disclosure as defined by the following claims.

What is claimed is:

1. A method of fabricating a storage node useable in a nonvolatile memory device, the method comprising:
    forming a lower metal layer;
    forming a first oxide on a surface of the lower metal layer;
    forming a middle metal layer on the first oxide;
    forming a second oxide on a surface of the middle metal layer;
    forming an upper metal layer on the second oxide;
    forming a carbon nanotube layer on the upper metal layer; and
    forming a passivation layer on the carbon nanotube layer.

2. The method of claim 1, wherein the forming of the lower metal layer includes forming an Aluminum layer, and wherein the forming of the first oxide includes anodizing the Aluminum layer so as to form a first $Al_2O_3$ layer on a surface of the Aluminum layer.

3. The method of claim 2, wherein the forming of the first oxide further includes etching a surface of the first $Al_2O_3$ layer and anodizing the Aluminum layer again so as to form a second $Al_2O_3$ layer on the surface of the Aluminum layer.

4. The method of claim 1, wherein the forming of the middle metal layer includes forming an Aluminum layer, and the forming of the second oxide includes anodizing the Aluminum layer so as to form a third $Al_2O_3$ layer on a surface of the Aluminum layer.

5. The method of claim 4, wherein the forming of the second oxide further includes etching a surface of the third $Al_2O_3$ layer and anodizing the Aluminum layer again so as to form a fourth $Al_2O_3$ layer on the surface of the Aluminum layer.

6. The method of claim 1, wherein the forming of the upper metal layer includes forming the upper metal layer with Gold.

7. The method of claim 1, wherein the forming of the carbon nanotube layer includes forming a fullerene layer.

8. The method of claim 7, wherein the fullerene layer includes at least one of a $C_{60}$ layer, a $C_{70}$ layer, a $C_{72}$ layer, a $C_{74}$ layer, a $C_{76}$ layer, a $C_{82}$ layer, a $C_{84}$ layer, a $C_{86}$ layer, and a $C_{116}$ layer.

9. The method of claim 1, wherein the forming of the passivation layer includes forming a silicon oxide layer.

10. The method of claim 1, wherein the forming of the passivation layer includes forming the passivation layer to a thickness of about 2 nm to about 20 nm.

\* \* \* \* \*